(12) United States Patent
Houston

(10) Patent No.: US 6,351,176 B1
(45) Date of Patent: Feb. 26, 2002

(54) PULSING OF BODY VOLTAGE FOR IMPROVED MOS INTEGRATED CIRCUIT PERFORMANCE

(75) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/395,027

(22) Filed: Sep. 13, 1999

Related U.S. Application Data

(60) Provisional application No. 60/100,202, filed on Sep. 14, 1998.

(51) Int. Cl.[7] .................................................. G05F 1/10
(52) U.S. Cl. ........................ 327/534; 327/537; 327/544
(58) Field of Search ................................ 327/534, 537, 327/544, 543; 326/31, 36

(56) References Cited

U.S. PATENT DOCUMENTS

| | | | | |
|---|---|---|---|---|
| 5,448,198 A | * | 9/1995 | Toyshima et al. ............ | 327/534 |
| 5,786,724 A | * | 7/1998 | Teggatz ....................... | 327/534 |
| 5,909,140 A | * | 6/1999 | Choi ........................... | 327/534 |
| 6,097,113 A | * | 8/2000 | Teraoka et al. ............. | 327/534 |
| 6,118,328 A | * | 9/2000 | Morikawa .................... | 327/534 |
| 6,150,869 A | * | 11/2000 | Storino et al. .............. | 327/534 |
| 6,177,826 B1 | * | 1/2001 | Mashiko et al. ............ | 327/534 |

* cited by examiner

*Primary Examiner*—Jung Ho Kim
(74) *Attorney, Agent, or Firm*—Pedro P. Hernandez; W. James Brady, III; Frederick J. Telecky, Jr.

(57) ABSTRACT

A circuit (300) employing metal-oxide-semiconductor (MOS) devices is disclosed. The circuit (300) includes a circuit portion (302) that provides a circuit function, and a body voltage adjust portion (304) which alters the body potential of the transistors within the circuit portion (302). By adjusting the body potentials of the circuit portion (300) transistors, the speed at which the circuit portion (300) can perform its function is increased. A decoder circuit embodiment (800) and sense amplifier embodiments (1200, 1300, 1500, 1600, 1700, 1800, 1900 and 2000) are also disclosed.

13 Claims, 7 Drawing Sheets

PULSING OF BODY VOLTAGE FOR IMPROVED MOS INTEGRATED CIRCUIT PERFORMANCE

This application claims priority under 35 USC §119(e)(1) of provisional application No. 60/100,202 filed Sep. 14, 1998.

TECHNICAL FIELD

The present invention relates generally to integrated circuits, and more particularly to integrated circuits having metal-oxide-semiconductor transistors.

BACKGROUND OF THE INVENTION

Metal-oxide-semiconductor (MOS) transistors continue to be a preferred technology for integrated circuits. MOS integrated circuits provide favorable power, speed, density, and noise characteristics. Complementary MOS (CMOS) integrated circuits in particular, provide low power, high noise margins, and large logic swings above and beyond most other common integrated circuit technologies.

Conventional CMOS circuits are well understood in the art. A side cross sectional view of a "bulk" CMOS integrated circuit is set forth in FIG. 1. The CMOS circuit 100 is formed on a p-type semiconductor substrate 102. An n-channel MOS (NMOS) transistor 104 is formed in the p-type substrate 102, and includes an NMOS gate 106, an NMOS source 108 and an NMOS drain 110. The NMOS source and drain (108 and 110) are shown to be formed from n-type diffusions within the p-type substrate 102. The circuit 100 further includes an n-type well 112 formed within the p-type substrate 102. In a similar fashion to the NMOS transistor 104, a p-channel MOS (PMOS) transistor 114 is formed within the n-well 112. The PMOS transistor 114 has a PMOS gate 116, a PMOS source 118 and a PMOS drain 120. The PMOS source and drain (118 and 120) are formed by p-type diffusions within the n-type well 112.

The substrate in which each transistor is formed is considered the "body" of the transistor. In particular, the p-type substrate 102 forms the body for NMOS transistor 104, and the n-type well 112 forms the body for PMOS transistor 114. As shown in FIG. 1, in a conventional CMOS configuration the p-type substrate (the body of the NMOS transistor 104) is coupled to the low power supply voltage VSS by a first supply substrate contact 122, and the n-type well (the body of the PMOS transistor 114) is coupled to the high power supply voltage VDD by a second supply substrate contact 124.

As is well understood in the art, when the circuit 100 is in operation, provided there is a sufficient potential across the NMOS source 108 and NMOS drain 110, when the gate-to-source voltage applied at the NMOS gate 106 exceeds an n-channel transistor threshold voltage (Vtn), a current path will be formed between the NMOS source 108 and NMOS drain 110. In this manner, the NMOS transistor 104 is switched on. When the gate-to-source voltage is less than Vtn, the NMOS transistor 104 is switched off. Similarly, provided there is a sufficient potential between PMOS source 118 and PMOS drain 120, when the gate-to-source voltage applied at PMOS gate 116 has an absolute value that is less than the absolute value of a p-channel threshold voltage (|Vtp|), PMOS transistor 114 is switched on. When the magnitude of the gate-to-source voltage is less than |Vtp|, PMOS transistor 114 is switched off.

The amount of current drawn by a MOS transistor ($I_{DS}$) is a function of Vgs−Vt, where Vgs is the gate-to-source voltage and Vt is the threshold voltage of the transistor. Thus, the value of Vt will affect the amount of current the transistor can source or sink (the "drive" current). Transistors with a lower threshold voltage will draw more current, and thus provide a faster switching action. Transistors with a higher threshold voltage will draw less current and result in a slower switching action. The threshold voltage of a MOS transistor also effects the leakage current of a transistor. When a transistor's Vgs voltage is less than the transistor's threshold voltage (the transistor is "off"), a leakage current will still be drawn by the transistors. The leakage current is also dependent upon the Vt value. A lower Vt value will result in higher leakage currents, while a higher Vt value will result in lower leakage currents. It is the above described switching of the transistors within the MOS circuit 100 that determines how fast the circuit 100 can operate. The particular circuit 100 of FIG. 1 illustrates a CMOS inverter. The inverter is set forth in a schematic diagram in FIG. 2, and identified by the general reference character 200. The PMOS transistor is shown as P200 and the NMOS transistor is shown as N200. The inverter 200 receives an input signal (IN) at an input node 202, and provides an output signal (OUT) at an output node 204 that is the inverse of the IN signal. When the IN signal exceeds the Vtn of transistor N200, the OUT signal is driven low (to VSS). When the IN signal is lower than VDD by the Vtp of transistor P200, the OUT signal is driven high (to VDD). Thus, the maximum speed at which the inverter 200 can operate depends, in part, upon the threshold voltages of its respective transistors.

It is known in the prior art to modulate the Vt of MOS transistors by altering the threshold voltage of the transistors. Such Vt modulation schemes have involved semiconductor-devices that have active modes, in which switching of transistors is likely to occur, and standby modes, in which switching of transistors is not likely to occur. In the standby mode, the Vt is raised, to limit leakage when the transistor is turned off. In the active modes, the Vt is lowered. Furthermore, within such Vt modulation schemes, the range to which the Vt values can be altered is limited, in order to prevent the forward biasing of the body-to-source pn junction. Maintaining body-to-source pn junction in the forward biased state can draw unacceptably large amounts of current. A drawback to driving body voltages in order to lower Vts throughout an active mode, is that maintaining transistor bodies at the low Vt inducing voltage for such a long period of time will draw considerable leakage current, resulting in increased active mode power consumption.

One example of a prior art scheme for modulating transistor Vts, is to couple the body of a transistor to its drain voltage according to a preceding input signal. When the input signal is active, indicating possible transistor switching actions, the body of the transistors will be coupled to the transistor drains, altering the body voltages and lowering the Vts of the transistors.

Referring once again to FIG. 1, as noted previously, the p-type substrate 102 is coupled to the low power supply voltage VSS (by first supply substrate contact 122), while the n-type well 112 is coupled to the high power supply voltage VDD (by second supply substrate contact 124). This arrangement helps to maintain the n-well 112 and p-type substrate 102 at a reverse bias state with respect to one another, and enabling NMOS and PMOS transistors to operate within the same semiconductor substrate.

"A 1-V 46-ns 16-Mb SOI DRAM with Body Control Technique" appearing in *IEEE Journal of Solid-State Circuits*, Vol. 32, No. 11, pages 1712–1719, and dated November 1997, by Shimomura et al. sets forth a silicon-on-insulator (SOI) dynamic random access memory (DRAM). The SOI DRAM includes SOI transistor circuits in which the transistor Vts are modulated by coupling the bodies of the transistor to "medium-level" voltage in order to lower the transistor Vts. The medium-level voltage is a voltage having a level between the power supply voltages, and is used to prevent forward biasing of the body-source/drain junctions. Transistors are returned to a higher Vt level by coupling the bodies to the power supply voltages.

Shimomura et al. in particular, illustrates a sense amplifier circuit having SOI transistors with bodies that are connected to the "medium-level" voltage at about the same time the sense amplifier is turned on. If reference is made to FIG. 5 of Shimomura et al., it is shown that in the disclosed sense amplifier scheme, the bodies of the cross-coupled transistors (M1–M4) are lowered during an initial "sense" period (when the data value on the bit lines is determined). Subsequently, during a "restore" period (when the bit lines are driven to refresh data in a memory cell), the bodies of the cross-coupled transistors are raised to a high Vt level. At the same time, the enabling transistors (M5 and M6) threshold voltages are lowered, speeding up the restore function.

Another example of transistor body voltage modulation is set forth in "SOI-DRAM Circuit Technologies for Low Power High Speed Multigiga Scale Memories" appearing in *IEEE Journal of Solid-State Circuits*, Vol. 31, No. 4, pages 586–591, and dated April 1996, by Kuge et al. In Kuge et al., logic circuits composed of SOI transistors have bodies that are forward biased with respect to their sources in an active mode. In a stand-by mode, body-source junctions are reverse biased. Kuge et al. contrasts the junction area of bulk CMOS transistors with that of SOI transistors, and notes that it is the small SOI junction area that keeps diode currents at acceptable levels. Kuge et al. also illustrates sensing schemes. If reference is made to FIG. 5 of Kuge et al., a conventional sensing scheme is illustrated, as well as sensing scheme in which the bodies of the sense amplifier transistors are coupled to their respective sources. If reference is made to FIG. 6, a sensing scheme is illustrated in which the bodies of the cross-coupled transistors are driven to different levels in order to lower the Vts of the transistors. There is no indication as how or when the bodies of the transistors are returned to their previous (high Vt) level.

A drawback to SOI approaches, such as that set forth in Shimomura et al. and Kuge et al., is that such approaches do not address the needs for "bulk" CMOS devices. Furthermore, SOI circuits can require more area than bulk CMOS circuits, and/or be more complex and more costly to manufacture.

While conventional CMOS arrangements, such as that illustrated by FIGS. 1 and 2, can provide adequate performance for some applications, such arrangements may not be sufficient for higher speed requirements. Thus, it would be desirable to provide improved speed for MOS integrated circuits, above and beyond what is achievable with conventional approaches. Due to the advantages of bulk CMOS devices, it would be desirable that such an arrangement be amenable to bulk CMOS circuits. At the same time, it is also desirable to limit the amount of power that is consumed by such integrated circuits.

SUMMARY OF THE INVENTION

According to the preferred embodiment, a circuit includes a number of insulated gate field effect transistors. The body potentials of the transistors are changed to lower the threshold voltages of the transistors. The lower threshold voltages allow the transistors to be activated faster and have a higher drive current, and thereby increase the operating speed of the circuit. Once the transistors within the circuit have been activated, the body potentials return to previous values, raising transistor threshold voltages, and thereby limiting leakage current. Body voltages are adjusted by pulsing the body with an adjust voltage to momentarily forward bias the body-source junction. The threshold voltages are briefly lowered, preferably in advance to transistor switching. The body can then be pulled back to a previous (high threshold voltage) value by diode current at the body-source junction.

According to one aspect of the preferred embodiment, the circuit is one portion of a larger integrated circuit device that is activated by a clock signal. The body potentials of the transistors are altered by the application of a voltage pulse generated in response to the clock signal.

According to another aspect of the preferred embodiment, the transistors within the circuit are activated in response to an input signal. The body potentials of the transistors are altered by the application of a voltage pulse generated in response to the input signal.

According to another aspect of the preferred embodiment, the body potentials of the transistors are altered by coupling the bodies to power supply voltages.

According to another aspect of the preferred embodiment, the body potentials of the transistors are altered by coupling the bodies to nodes within the circuit that are higher than the low power supply voltage, and lower than the high power supply voltage.

According to another aspect of the preferred embodiment, the body potentials of the transistors are altered by allowing the bodies to float.

According to another aspect of the preferred embodiment, the circuit is a decoder circuit.

According to another aspects of the preferred embodiment, the circuit is a sense amplifier circuit.

DETAILED DESCRIPTION OF THE EMBODIMENTS

The embodiments set forth herein illustrate an approach to activating the transistors within a MOS integrated circuit by dynamically adjusting the body voltages of the transistors. Prior to a switching action, body voltages of transistors are pulsed, causing the transistor threshold voltages to be lowered. The lower threshold voltages result in faster switching speeds. Following the switching action, the transistor body voltages return to previous values, causing the transistor threshold voltages to rise. The higher threshold voltages result in reduced current leakage, and hence reduced power consumption.

Figure 3:
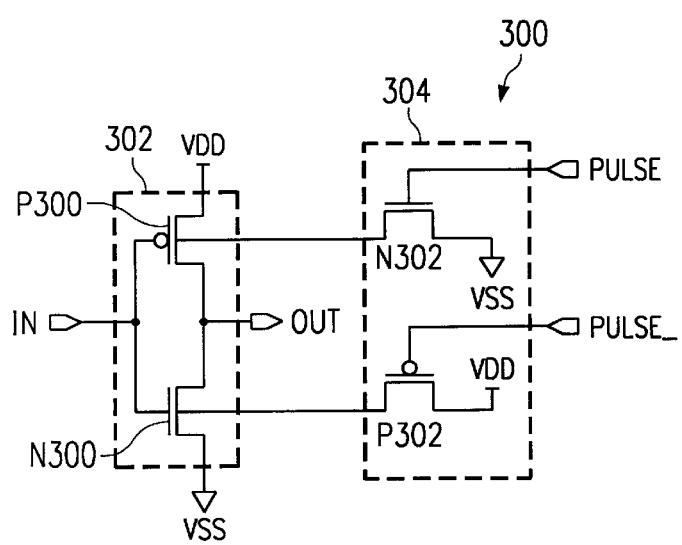
FIG. 3 is a schematic diagram of a first embodiment.

Referring now to FIG. 3, a schematic diagram is set forth illustrating a first embodiment. The first embodiment is designated by the general reference character 300, and is shown to include a circuit portion 302 and a body voltage adjust portion 304. The circuit portion 302 is shown to include an n-channel first MOS circuit transistor N300 and a p-channel second MOS circuit transistor P300. In the first embodiment 300, the circuit portion 302 is shown to be a CMOS inverter. However, it is understood that the circuit portion 302 could be another type of circuit, such as a logic circuit or analog circuit having transistors whose switching speeds are to be improved. The circuit portion 302 is shown to be coupled between a high power supply voltage VDD and a low power supply voltage VSS. Furthermore, the circuit portion 302 receives an input signal (shown as IN) and provides an output signal (shown as OUT). According to the IN signal, the various devices within the circuit portion 302 are activated to generate the OUT signal.

The bodies of the transistors N300 and P300 are coupled to the body voltage adjust portion 304. In the first embodiment 300, the body voltage adjust portion 304 will pulse the bodies of the transistors within the circuit portion 302 and thereby lower the resulting threshold voltages of the transistors. In particular, the body of transistor P300 will be pulsed to a lower voltage, lowering its threshold voltage, while the body of transistor N300 will be pulsed to a higher voltage to lower its threshold voltage.

The threshold adjust portion 304 of the first embodiment 300 is shown to include a p-channel first adjust transistor P302, that couples the body of transistor N300 to the high power supply voltage VDD. The gate of transistor P302 receives a PULSE_ signal. The threshold adjust portion 304 further includes an n-channel second adjust transistor N302, which couples the body of transistor P300 to the low power supply voltage VSS. The gate of transistor N302 receives a PULSE signal that is the inverse of the PULSE_ signal. The PULSE signal is activated by pulsing high, and turning on its associated transistor N302. In the same fashion, the PULSE_ signal is activated by pulsing low and thereby turning on transistor P302. In this manner, the first embodiment 300 pulses transistor bodies to power supply voltages, as opposed to some intermediate voltage between the power supply voltages.

In the first embodiment 300, the timing of the PULSE and PULSE_ signals is intended to precede the possible activation of the transistors within circuit portion 302. That is, transistor bodies are pulsed prior to the actual switching action of the transistors. This is in contrast to prior art approaches that maintain transistor bodies at a low Vt level throughout an "active mode." For example, the circuit portion 302 could be part of a larger integrated circuit that is activated in response to an applied clock signal. As just one example, the circuit portion 302 could be a smaller part of a random access memory (RAM) in which circuits are activated according to internal timing signal. In such a case, any transitions in the IN signal would be expected to follow from transitions in the timing signal. The PULSE and PULSE_ signals would be activated prior to transitions in the IN signal, to "set-up" the circuit portion 302 for a rapid transition operation by lowering the threshold voltages of the transistors within the circuit portion 302.

Figure 4:
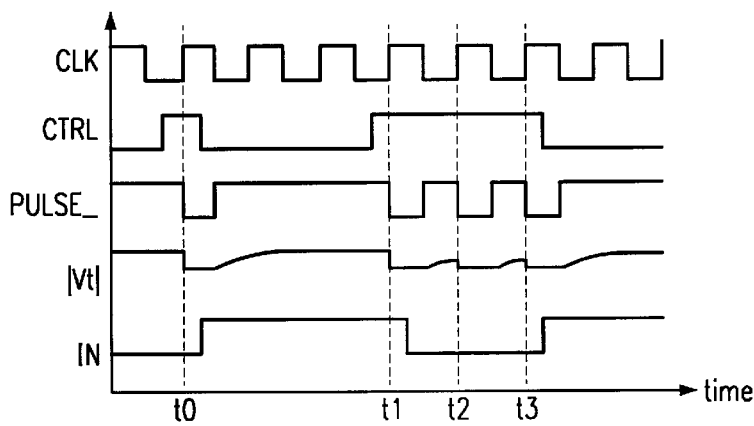
FIG. 4 is a timing diagram illustrating the general operation of the first embodiment.

The above-described timing is best understood with reference to FIG. 4. FIG. 4 is a timing diagram illustrating the operation of the first embodiment 300. FIG. 4 sets forth five waveforms, including the PULSE_ signal and the IN signal. In addition, FIG. 4 includes a system CLK signal, a control signal CTRL, and an absolute value threshold voltage waveform |Vt|. Active cycles in the larger integrated circuit are initiated by the CTRL signal being high on the rising edge of the CLK signal. Thus, the times t0, t1, t2, and t3 all designate the start of an active cycle (anticipated switching of the transistors within the circuit portion 302). The PULSE_ (and PULSE) signal is activated at the start of each active cycle, lowering the threshold voltage of the transistors within the circuit portion 302. This is represented by the |Vt| waveform, which is intended to show that the magnitude of both the Vtn and Vtp values can be lowered.

At time t0, the CTRL signal is high when the CLK signal transitions high, starting an active cycle. The PULSE_ signal goes low and the PULSE signal goes high, activating threshold adjust transistors P302 and N302. The body of transistor N300 is raised and the body of transistor P300 is lowered. This results in the threshold voltages of transistors P300 and N300 being reduced. Following a delay, the particular function of the larger integrated circuit results in the IN signal going high. Because the threshold voltages of the circuit portion 302 were lowered in advance by the PULSE_ signal, the IN transition will result in a more rapid OUT transition. This arrangement can provide better performance to approaches that would lower threshold voltages simultaneously with transitions in the IN signal.

Following the termination of the low-going PULSE_ signal, as shown by the |Vt| waveform, the threshold voltage will begin to rise back up to its original value. The return of the transistor bodies to a high Vt voltage is accomplished by the body-source pn junction. It is noted that the first embodiment 300 does not maintain the bodies at the lower Vt voltage, but uses a pulse to the adjust voltages to momentarily draw body-source junction current. This allows the bodies to return slowly to the high threshold voltage level. In this manner, the pulsing adjust approach illustrated in FIG. 4 can reduce active power consumption over cases in which the transistor bodies are maintained at a low threshold voltage level. Furthermore, because the Vt level will return relatively slowly to the high Vt level, there is no need to maintain the bodies at the low Vt level, as is done in the prior art.

Times t1, t2 and t3 illustrate three consecutive active operations, and thus three consecutive PULSE_ signal pulses. The consecutive PULSE_ pulses cause the |Vt| waveform to make three drops. It is noted that the IN signal makes transitions after time t1 and time t3, but not time t2. This illustrates how a threshold adjusting pulse (such as PULSE or PULSE_) is not necessarily dependent upon the CTRL signal. In addition, it is also noted that when the IN signal transitions low after time t1, the body of the p-channel transistor P300 will have been pulsed low, resulting in a lower Vtp for the transistor. In this manner, transistor P3000 will switch on faster and have greater drive current, resulting in a faster response for the circuit portion 302.

It is understood that while the operation set forth in FIG. 4 illustrates a case in which the PULSE and PULSE_ signals have a duration that is equivalent to the CLK signal pulse duration. This should not be construed as limiting the invention. The PULSE and PULSE_ signal pulses can have durations that are less than the CLK pulses. Furthermore, it is noted that while the PULSE and PULSE_ signals are active while the CTRL signal is high, this is not meant to imply that PULSE and PULSE_ signals are always activated when the CTRL signal is high. For example, in the event the overall integrated circuit device is active, but the circuit portion 302 transistors are not expected to be turned on, the PULSE_ signal could remain high (and the PULSE signal low).

In the first embodiment 300, the resulting potential that a body will be adjusted to depends upon the size of the adjusting transistors (P302 and N302), the duration of the pulse, and the size of the pn junction created by the sources of the circuit transistors (P300 and N300) and their respective bodies. For lower voltage systems, the first embodiment 300 can adjust the body potential without drawing excessive forward biased junction diode current. However, for higher voltage systems, the first embodiment 300 could be changed to reduce the amount of current drawn. For example, the size of the adjusting transistors (P302 and N302) (their width-to-length ratio (W/L)) could be small relative to the areas of the source-body pn junctions. Alternatively, the configuration set forth in FIG. 5 could be utilized.

Figure 5:
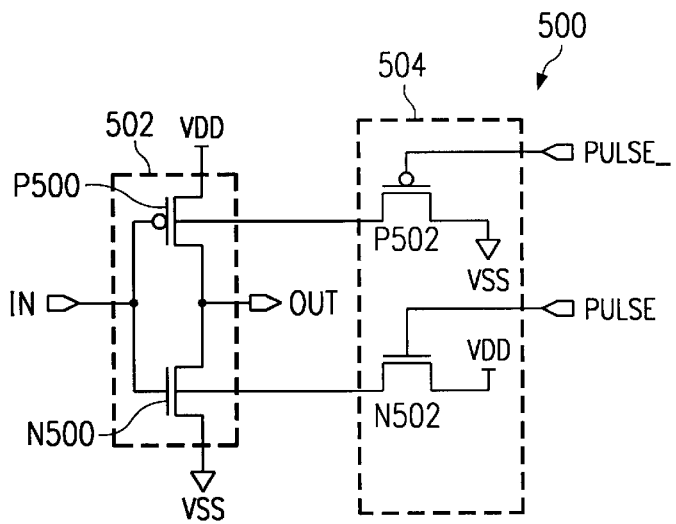
FIG. 5 is a schematic diagram of a second embodiment.

FIG. 5 is a schematic diagram of a second embodiment. The second embodiment 500 has the same general configuration as the first embodiment 300, and so is amenable to the variations discussed in conjunction with the first embodiment 300. The second embodiment 500 includes a circuit portion 502 and a body voltage adjust portion 504. The circuit portion 502 is identical to that of FIG. 3, but the body voltage adjust portion 504 differs from the first embodiment 300 in that the body of the p-channel circuit transistor P500 is pulled to a low pulse voltage VSS by a p-channel adjust transistor P502. Similarly, the body of the n-channel circuit transistor N500 is pulsed to a high pulse voltage VDD by an n-channel transistor N502. The arrangement of FIG. 5 prevents the body of transistor P500 from being pulled any lower than one Vtp above VSS. In the same general fashion, the body of transistor N500 is prevented from being pulled to a potential higher than one Vtn below the VDD voltage. By limiting the magnitude of the pulse voltages, excessive forward biasing of the source-body pn junctions can be prevented.

Figure 1:
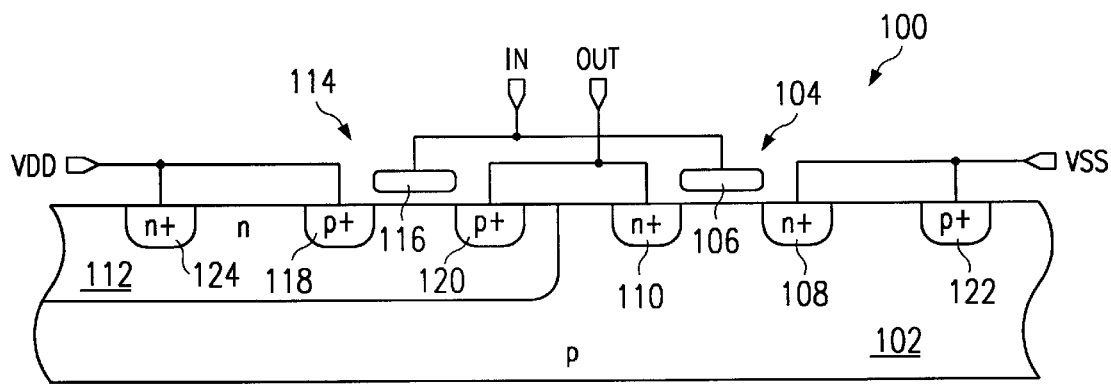
FIG. 1 is a side cross sectional view of a MOS integrated circuit of the prior art.
Figure 2:
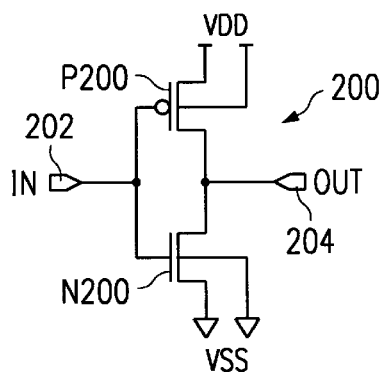
FIG. 2 is a schematic diagram of the prior art circuit set forth in FIG. 1.
Figure 6:
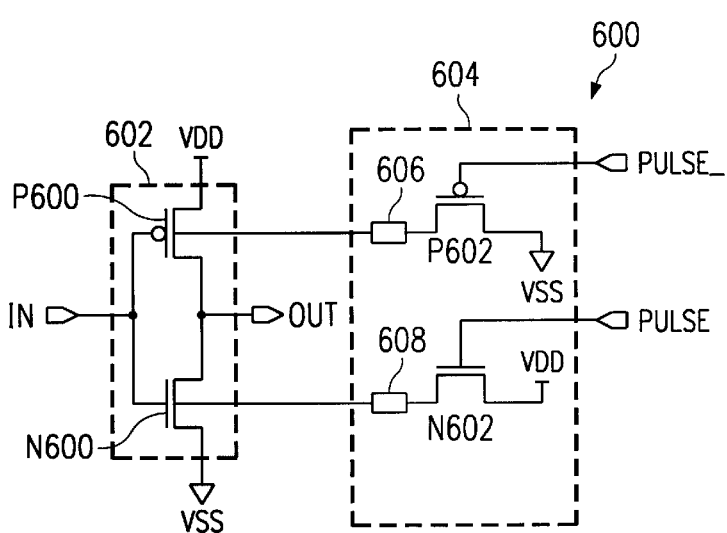
FIG. 6 is a schematic diagram of a third embodiment.

FIG. 6 illustrates a third embodiment 600 capable of providing alternate ways of adjusting the body potential of circuit transistors. The third embodiment 600 includes a circuit portion 602 and body voltage adjust portion 604. The circuit portion 602 is the same as that of FIGS. 1 and 3, and so is subject to the same possible variations discussed above. The body voltage adjust portion 604 differs from the first and second embodiments (304 and 504) in that the adjust transistors (N602 and P602) are coupled to the bodies of circuit transistors (N600 and P600) by voltage drop devices, shown as 606 and 608. The voltage drop devices (606 and 608) introduce a voltage drop between the drains of the adjust transistors (N602 and P602) and their respective bodies. It is understood that in the event the circuit portion 602 contained additional transistors, other voltage drop devices could be employed to adjust the body potential of the additional transistors. In this manner, the bodies of different transistors could be adjusted to different voltages by utilizing different voltage drop devices.

Figure 7A:
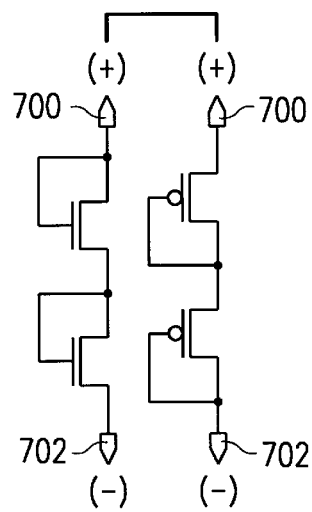
FIGS. 7A–7C are schematic diagrams of voltage drop devices that may be used with the third embodiment.
Figure 7B:
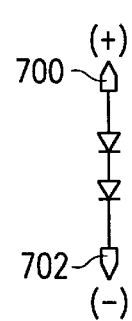
Figure 7C:
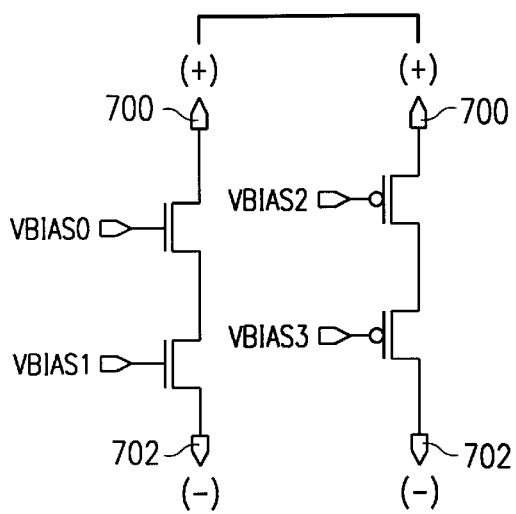

FIGS. 7A–7C set forth examples of devices that may be used as the voltage drop devices, shown as items 606 and 608 in FIG. 6. Each example is shown to have a high potential node 700 and a low potential node 702. In the event the voltage drop device is used as voltage drop device 606 in FIG. 6, the high potential node 700 would be coupled to the body of transistor P600 while the low potential node 702 would be coupled to the source of transistor N602. Conversely, in the event the voltage drop device is used as voltage drop device 608 of FIG. 6, the high potential node 700 would be coupled to the source of transistor N602, and the low potential node 702 would be coupled to the body of transistor N600.

The voltage drop devices of FIG. 7A are shown to include a number of MOS transistors arranged in series, each in a "diode" configuration. The two examples of FIG. 7A show one voltage drop device utilizing n-channel MOS transistors and another using p-channel transistors. While FIG. 7A shows two MOS devices arranged in series, it is understood that fewer transistors could be used to create a smaller voltage drop, while a greater number of transistors could be used to increase the voltage drop. The voltage drop device of FIG. 7B is shown to include the series arrangement of diodes. The voltage drop can be further adjusted by increasing or decreasing the number of diodes. Lastly, the voltage drop devices of FIG. 7C are shown to include the series arrangement of MOS transistors, each of which has a gate that receives a bias voltage. The bias voltages can be adjusted to provide the desired voltage drop.

Figure 8A:
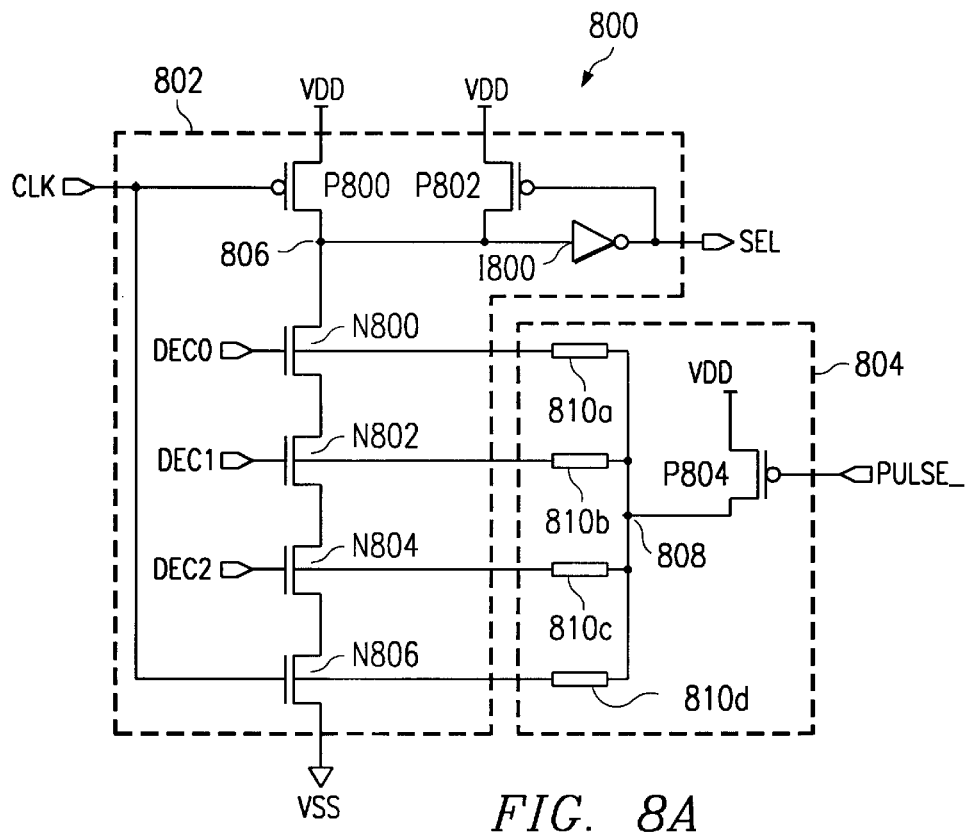
FIGS. 8A–8C sets forth schematic diagrams and a timing diagram of a fourth embodiment.
Figure 8B:
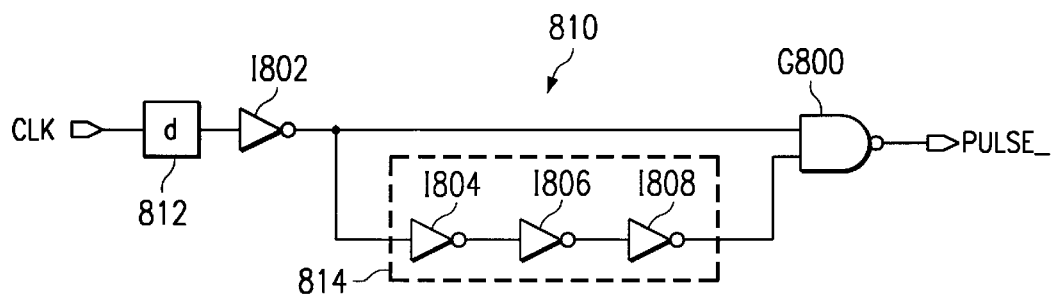
Figure 8C:
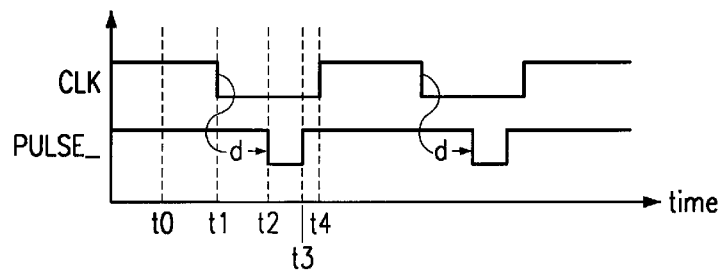

A fourth embodiment is set forth in FIGS. 8A–8C. FIG. 8A sets forth a clocked circuit, designated by the reference character 800. The clocked circuit 800 includes a circuit portion 802 and a body voltage adjust portion 804. The circuit portion 802 of the fourth embodiment is a dynamic decoder circuit. The circuit is "dynamic" in the sense that it is enabled by a clock signal CLK. In addition to the CLK signal, the circuit portion 802 receives decoder signals DEC0–DEC2, and in response thereto, provides a select signal SEL. The circuit portion 802 includes three n-channel decoder transistors N800, N802 and N804 having source-drain paths arranged in series. Transistors N800, N802 and N804 are further arranged in series with an n-channel enable transistor N806 between a precharge node 806 and a low power supply voltage VSS. The gates of transistors N800, N802 and N804 receive the DEC0, DEC1 and DEC2 signals, respectively. The gate of transistor N806 receives the CLK signal. The circuit portion 802 further includes a p-channel precharge transistor P800, which has a source-drain path coupled between the precharge node 806 and a high power supply voltage VDD. The gate of transistor P800 also receives the clock signal CLK.

A high potential at the precharge node 806 is latched by a feedback circuit that includes an inverter I800 and feedback transistor P802. Transistor P802 has a source-drain path coupled between the precharge node 806 and high power supply voltage VDD. Inverter I800 has an input coupled to the precharge node 806 and an output coupled to the gate of transistor P802. The output of inverter I800 provides the SEL signal.

When the CLK signal is low, the precharge node 806 is pulled to a high voltage, forcing the SEL signal low. Provided all of the decoder signals DEC0–DEC2 are high, when the CLK signal goes high, the precharge node 806 will be discharged via transistors N800, N802, N804 and N806. In this manner, the circuit portion 802, when activated, is activated in synchronism with the clock signal CLK.

The body voltage adjust portion 804 of the fourth embodiment is shown to include a p-channel adjust transistors P804 having a source-drain path coupled between the high power supply voltage VDD and an adjust node 808. The gate of transistor-P804 receives a PULSE_ signal. The adjust node 808 is coupled to the bodies of transistors N800, N802, N804 and N806, by impedance devices 810a–810d, respectively. When the PULSE_ signal is high, transistor P804 is turned off, and the bodies of transistors N800, N802, N804 and N806 are at a lower potential, giving transistors N800, N802, N804 and N806 higher threshold voltages. This reduces leakage, and hence the stand-by (i.e., non-switching) power consumption of the device. Prior to the activation of the CLK signal (a low-to-high transition), the PULSE_ signal will pulse low, turning on transistor P804. The bodies of transistors N800, N802, N804 and N806 will be raised in potential, reducing the threshold voltages of the n-channel transistors. When the CLK and DEC0–DEC2 signals are high, the lower threshold voltages of transistors N800, N802, N804 and N806 will result in faster discharge of the precharge node 806. In this manner, an initial PULSE_ lowers the threshold voltages of transistors within the circuit portion 802 prior to the dynamic activation of the circuit portion 802 by the CLK signal.

It is noted that when the threshold voltages of transistors N800, N802, N804 and N806 are lowered, the leakage voltages of these devices will increase. The leakage must be kept small enough to prevent overpowering the feedback transistor P802 (which is a small device).

FIG. 8B sets forth a timing circuit for the fourth embodiment. The timing circuit is designated by the general reference character 810, and generates the PULSE_ signal from the CLK signal. The timing circuit ensures that the PULSE_ signal will go low before the CLK signal is active (high). The timing circuit 810 includes a delay element 812 that receives the CLK signal. The output of the delay element 812 is inverted by an inverter I802, and applied directly to one input of a two-input NAND gate G800. Of course, the delay element 812 could also be situated after the output of gate G800. The output of inverter I802 is also applied to the second input of gate G800 by way of an inverting delay circuit 814. The output of gate G800 provides the PULSE_ signal. The inverting delay circuit 814 establishes the duration of the PULSE_ signal pulse, and includes the series arrangement of three inverters I804, I806 and I808. It is understood that other pulse generating circuits could be used to generate pulses in the PULSE_ signal in response to clock signal transitions, and the particular timing circuit of FIG. 8B should not be construed as limiting the present invention thereto.

FIG. 8C is a timing diagram illustrating the operation of the timing circuit 810 set forth in FIG. 8B. At time t0, the CLK signal is high, resulting in a low logic value being applied to a first input of gate G800 and a high logic value being applied to a second input of G800. The PULSE_ signal is forced high.

At time t1, the CLK signal transitions low. Following a delay introduced by delay element 812, the high-to-low transition of the clock signal results in a low-to-high transition being applied at the first input of gate G800. This results in the PULSE_ signal going low at time t2. The low PULSE_ signal lowers the threshold voltages within the circuit portion 802. At the same time, the low-to-high transition begins propagating through the inverting delay circuit 814. At time t3, the low-to-high transition has propagated through the inverting delay circuit 814, resulting in a high-to-low transition at the second input of gate G800. In this manner, the low-going PULSE_ signal is terminated.

At time t4, shortly after the termination of the low-going PULSE_ signal, the CLK signal transitions high. The high CLK signal activates various transistors within the circuit portion 802. Due to the preceding PULSE_ signal pulse, the threshold voltages of the circuit portion transistors 802 are low, allowing for rapid switching of the transistors.

Due to the important role that decoding circuits plays in memory devices, the utilization of body voltage adjustments in a decoder circuit, such as that set forth in FIGS. 8A and 8B, can provide particular speed advantages for a memory device.

Wile fast decoder circuits can be a particularly advantageous embodiment of the present invention, it is understood that the decoder circuit of FIG. 8A presents but one application of the invention to a dynamic circuit, and should not be construed as limiting the invention. The invention can be applied to other dynamic circuits implementing various logic functions with parallel, as well as serially connected transistors. Also, the timing of the pulse used to alter the potential of the transistor bodies can be varied to begin before, simultaneously with, or after the clock edge.

The previously described embodiments shown in FIGS. 3, 5, 6, 8A and 8B have utilized a low power supply voltage VSS to lower the potential of p-channel transistor bodies, and the high power supply voltage VDD to raise the potential of n-channel transistor bodies. In the event the larger integrated circuit includes supply voltages that are higher than the high power supply voltages, or lower than the low power supply voltages (referred to as "outside-the-rail" supplies), the outside-the-rail supplies can be used to modulate the voltage of transistor bodies, and thus increase switching speed. A first example of a device utilizing such supply voltages is set forth in FIG. 9.

Figure 9:
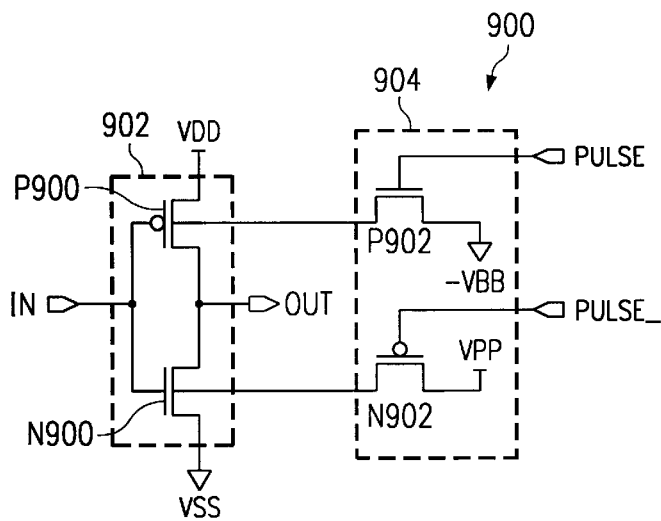
FIG. 9 is a schematic diagram illustrating a fifth embodiment.

The fifth embodiment of FIG. 9 is designated by the general reference character 900 and includes a circuit portion 902 and a body voltage adjust portion 904. The larger integrated circuit containing the fifth embodiment 900 includes a supply voltage VPP that is greater than the high power supply voltage VDD, and a supply voltage—VBB that is less than the low power supply voltage. These voltages (VPP and –VBB) may be generated from an off-chip supply or generated on-chip. The circuit portion 902 includes a p-channel transistor P900 and an n-channel transistor N900. The circuit portion 902 is shown to be disposed between the power supply voltages VDD and VSS.

The body voltage adjust portion 904 includes an n-channel first adjust transistor N902 and a p-channel second adjust transistor P902. The gate of transistor N902 receives the PULSE signal and the gate of transistor P902 receives the PULSE_ signal. The source-drain path of transistor N902 couples the body of transistor P900 to a lower voltage. Unlike the previously described embodiments, the body of p-channel transistor P900 is coupled to the supply voltage—VBB and not the VSS voltage. Similarly, the body of n-channel transistor N900 is coupled to the supply voltage VPP and not the VDD voltage.

It is noted that in the event such outside-the-rail voltages are used, the PULSE and/or PULSE_ signals must have a sufficient swing to ensure that the adjust transistors are turned off. Thus, the PULSE signal of FIG. 9 may have a low logic level that is below VSS, or the PULSE_ signal may have a high logic level that is above VDD.

As an alternative, either or both of the voltages (-VBB and VPP) can be intermediate voltages between VDD and VSS. In a special case, the same intermediate voltage can be used for both—VBB and VPP.

The first through fifth embodiments have assumed that the bodies of transistors within the circuit portions would be pulled back to a supply voltage following the adjusting pulse. For example, the bodies of the p-channel devices, after being pulsed low, would return to a high power supply voltage VDD. In the same fashion, the bodies of n-channel devices, after being pulsed high, would return to the low power supply voltage VSS. This will occur from the action of the body-to-source junction diode. Alternatively, additional circuitry can be used to control the body voltage for the high Vt state. In the event outside-the-rail supplies are available, the bodies of the circuit transistors could be coupled to the outside-the-rail supplies for the high Vt state, and then pulsed to the power supply voltages to reduce threshold voltages. Such an arrangement can be particularly advantageous in reducing the leakage current of the circuit portion devices by avoiding the forward biasing of the body-to-source junction diode. One example of a circuit that biases bodies to outside-the-rail supplies is set forth in FIG. 10.

Figure 10:
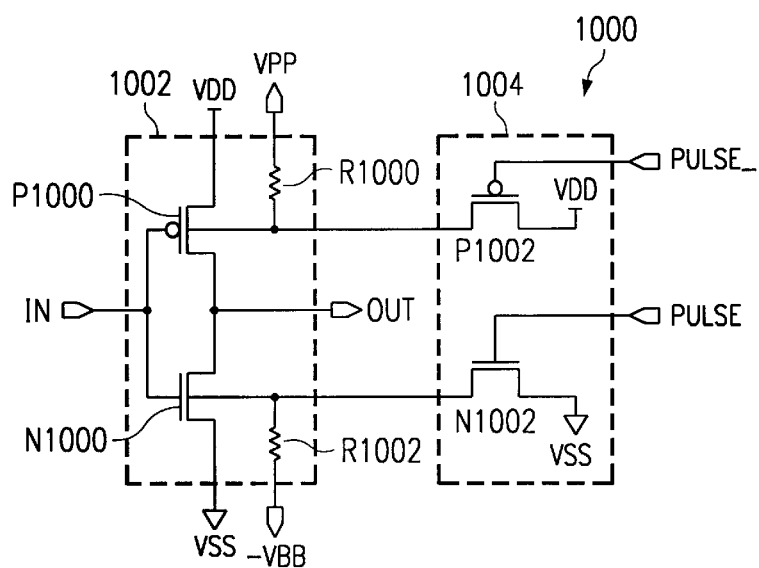
FIG. 10 is a schematic diagram illustrating a sixth embodiment.

FIG. 10 illustrates a sixth embodiment, designated by the general reference character 1000, that is shown to include a circuit portion 1002 and a body voltage adjust portion 1004. The circuit portion 1002 includes a p-channel transistor P1000 and an n-channel transistor N1000. According to an input signal IN, the transistors within the circuit portion 1002 are switched on and off to generate an output signal OUT. The circuit portion 1002 is shown to be coupled between a high power supply voltage VDD and a low power supply voltage VSS. Unlike previous embodiments, the body of transistor P1000 is coupled to a VPP voltage by way of a resistance R1000. The VPP voltage is greater than the VDD power supply voltage. With this arrangement, the body of transistor P1000 can be pulled to a potential above that of VDD, increasing the threshold voltage of transistor P1000, and thereby reducing leakage current. In the same general fashion, the body of transistor N1000 is coupled to a—VBB potential by a resistance R1002. The-VBB voltage is less than the low power supply voltage VSS, and so can pull the body of transistor N1000 to a potential lower than the VSS voltage. This can increase the threshold voltage of transistor N1000, and thereby reduce leakage current. The values of resistors R1000 and R1002, in conjunction with the capacitance on the body nodes, will determine how quickly the transistors will transition from the low Vt state.

The body voltage adjust portion 1004 is shown to include a p-channel first adjust transistor P1002 having a source-drain path coupled between body of transistor P1000 and the high power supply voltage VDD. The gate of transistor P1002 receives a PULSE_ signal. When the PULSE_ signal is active (pulses low), transistor P1002 turns on, lowering the potential of the body of transistor P1000 from the outside-the-rail voltage, thereby reducing the Vtp of the transistor. In the same general fashion, the body of transistor N1000 is coupled to the low power supply voltage VSS by the source-drain path of an n-channel second adjust transistor N1002. The gate of transistor N1002 receives a PULSE signal. When PULSE is active (pulses high), transistor N1002 is turned on, and pulls the body of transistor N1000 toward VSS, raising the body potential. In this way, the bodies can be maintained at outside-the-rail potentials, and modulated to reduce threshold voltages using the power supply voltages. As noted in conjunction with the fifth embodiment of FIG. 9, the PULSE and PULSE_ signals of the sixth embodiment 1000 must have sufficient voltage swing to turn off their respective adjust transistors. For example, the PULSE_ signal would have to swing up to the VPP potential to turn off transistor P1002, and the PULSE signal would have to swing low to the—VBB potential to turn off transistor N1002.

As with the other embodiments, the sixth embodiment could have a number of variations. As just one possible variation, the resistors R1000 and R1002 may be replaced by other circuit elements. For example, a transistor may be placed in series with (or replace) the resistors, and receive a control signal such as PULSE and PULSE_ to reduce or eliminate current to the VPP supply or the—VBB supply when the transistor body is being pulsed to the low Vt state.

Figure 11A:
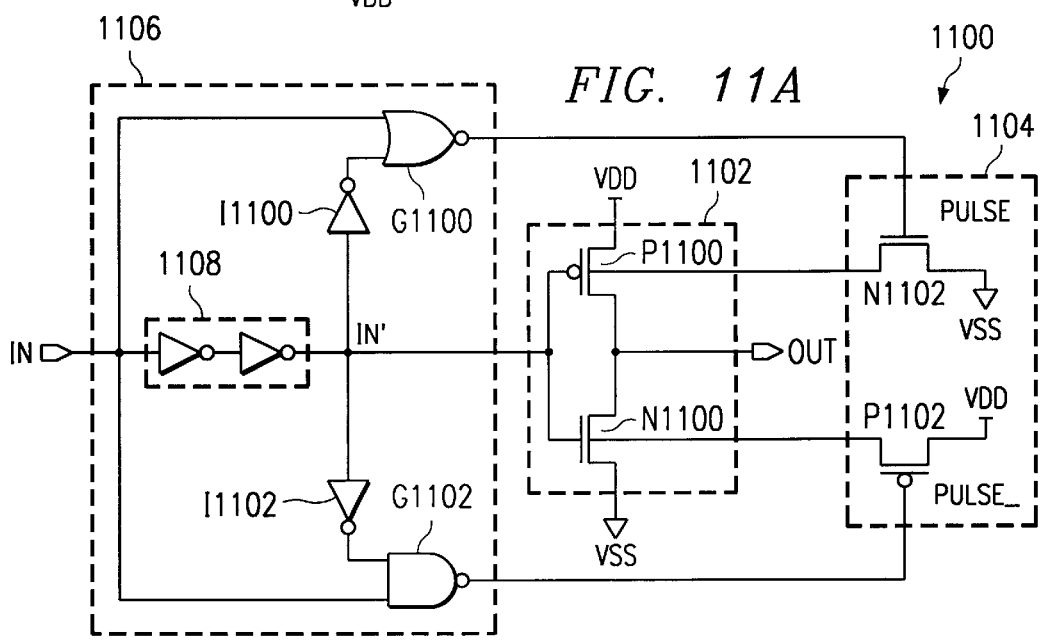
FIGS. 11A and 11B set forth a schematic diagram and timing diagram for a seventh embodiment.
Figure 11B:
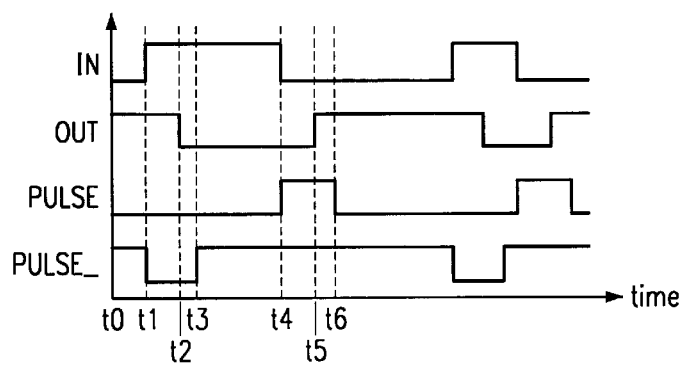

The first through sixth embodiments have illustrated arrangements in which the body voltage adjust portions are activated by a timing signal (PULSE and/or PULSE_) related to other timing signals (such as CLK). Such arrangements can be advantageous, but should not be construed as limiting the present invention thereto. The adjustment of body potentials could be initiated by the input logic signals to the circuit itself. An example of such an approach is set forth in FIGS. 11A and 11B. FIGS. 11A and 11B also illustrate an approach that adjusts the body voltage of given transistors according to whether or not the transistors will be switched. Thus, if an input signal will result in a p-channel transistor turning on and an n-channel transistor turning off, the approach of FIGS. 11A and 11B would pulse the body of the p-channel transistor before it is turned on (by activating a PULSE signal), while the body of the n-channel transistor would not be adjusted (the PULSE_ signal will remain inactive). This departs from the previously described embodiments in which the PULSE and PULSE_ signals are activated simultaneously.

FIG. 11A sets forth a seventh embodiment having transistors with bodies that are adjusted in response to an input logic signal. The seventh embodiment is designated by the general reference character 1100, and is shown to include a circuit portion 1102, a body voltage adjust portion 1104, and a timing circuit 1106. The circuit portion 1102 and body voltage adjust portion 1104 are essentially the same as that set forth in FIG. 3, and so can be considerably varied as mentioned in conjunction with the previous embodiments. The circuit portion 1102 includes a p-channel transistor P1100 and an n-channel transistor N1100 disposed between a high power supply voltage VDD and low power supply voltage VSS. The circuit portion 1102 switches its respective transistors in response to an input signal IN, received by way of the timing circuit 1106, to generate an output signal OUT.

The body voltage adjust portion 1104 includes an n-channel first adjust transistor N1102 having a source-drain path coupled between the body of transistor P1100 and the low power supply voltage VSS, and a p-channel second adjust transistor P1102 having a source-drain path coupled between the body of transistor N1100 and the high power supply voltage VDD. While the gates of transistors N1102 and P1102 receive a PULSE and a PULSE_ signal, respectively, the PULSE and PULSE_ signals of FIG. 1A are not activated in response to a clock signal. Instead, the PULSE and PULSE_ signals of the seventh embodiment 1100 are provided by the timing circuit 1106 which receives the IN signal. In this manner, the body voltage adjust portion 1104 is activated by the input signal to the circuit portion 1102 and not a timing signal used by a larger integrated circuit containing the seventh embodiment.

The timing circuit 1106 of the seventh embodiment 1100 is shown to include a pulse delay 1108 that receives and delays the IN signal, to generate an IN' signal. The pulse delay 1108 is shown to include two inverters in series. The IN' signal is provided as an input to the circuit portion 1102. The timing circuit 1106 further includes a first pulse gate G1100 and a second pulse gate G1102, which each receive the IN and IN' signals. The first pulse gate G1100 is shown to be a two-input NOR gate that receives the IN signal at a first input. The IN' signal is received at the second input by way of an inverter I1100. The second pulse gate G1102 is shown to be a two-input NAND gate that receives the IN signal at a first input, and the IN' signal (by way of inverter I1102) at a second input.

The operation of the seventh embodiment 1100 is best understood with reference to FIG. 11B, which is a timing diagram illustrating a sample IN signal, and the resulting OUT, PULSE, and PULSE_ signals. At time t0, the IN signal is low. The inputs of the pulse gates (G1100 and G1102) include one high input and one low input. Thus, the output of gate G1100 is low, turning off transistor N1102, and allowing the body of transistor P1100 to remain at a relatively high potential. At the same time, the output of gate G1102 is high, turning off transistor P1102, and allowing the body of transistor N1100 to remain at a relatively low potential. In this state, the body potentials of transistors P1100 and N1100 remain relatively high, reducing leakage.

At time t1, the IN signal transitions from low-to-high. In the particular embodiment of FIG. 11A, the logic transitions of the IN signal determine which pulse signal (PULSE and PULSE_) will be activated. When the IN signal transitions high, both inputs of the pulse gates G1100 and G1102 will go high. The high input signals have no effect on the output of gate G1100, which remains low and keeps transistor N1102 off. In contrast, the high inputs to the gate G1102 result in the output of gate G1102 (the PULSE_ signal) going low. This turns on transistor P1102, resulting in the body of transistor N1100 being pulled to a higher potential, and hence the Vtn of transistor N1100 being lowered. Also at time t1, the low-to-high transition begins propagating through the pulse delay 1108.

At time t2, the low-to-high transition in the IN signal propagates through the pulse delay 1108, turning on transistors N1100 to drive the OUT signal low. The lowered Vtn of transistor N1100 allows for a faster operating speed in the circuit portion 1104. In this manner, the body voltages of transistors within the circuit portion 1102 are pulsed to alter the threshold voltages of those transistors that will be switched by an input signal. Those transistors that will not be switched, will not be altered.

At time t3, the low-to-high IN signal transition has propagated through the pulse delay 1108 and inverters I1100 and I1102, resulting in the inputs to the pulse gates G1100 and G1102 being complementary values. Transistor P1102 is turned off, while transistor N1102 remains off. With transistor P1102 off, the body of transistor N1100 will begin to fall in potential, returning to its previous potential.

At time t4, the IN signal transitions from high-to-low. As a result, both inputs of the pulse gates G1100 and G1102 go low. The output of gate G1100 (the PULSE signal) goes high, turning on transistor N1102. The body of transistor P1100 is coupled to the low power supply voltage VSS, lowering the body potential of transistor P1100 and thereby reducing the magnitude of its Vtp. The output of gate G1102 remains high, and transistor P1102 is kept off.

At time t5, the high-to-low IN transition propagates through the pulse delay 1108, turning on transistor P1100 and resulting in the OUT signal going high. The reduced magnitude of transistor P1100's Vtp results in faster switching of the circuit portion 1102. Transistor N1100 remains turned off, and its body potential is not altered. In this manner, an opposite transition in the IN signal results in a different body potential being adjusted.

At time t6, the high-to-low IN signal transition propagates through the inverters I1100 and I1102, terminating the PULSE_ signal low-going pulse. With transistor N1102 turned off, the body of transistor P1100 will begin to rise to its previous level.

The previously described embodiments have illustrated cases in which essentially digital circuits have the body potentials of their transistors adjusted to alter threshold voltages, and thereby increase performance. The teachings of the present invention are not limited to such applications, and can be particularly advantageous for high-speed analog circuits. One particular high-speed analog circuit application is the sense amplifier. Sense amplifiers are commonly employed in memory devices and programmable logic devices for sensing data values. In such applications, increasing the speed at which a sense amplifier can sense a data value can significantly increase the overall speed of the device in which it is used.

Figure 12:
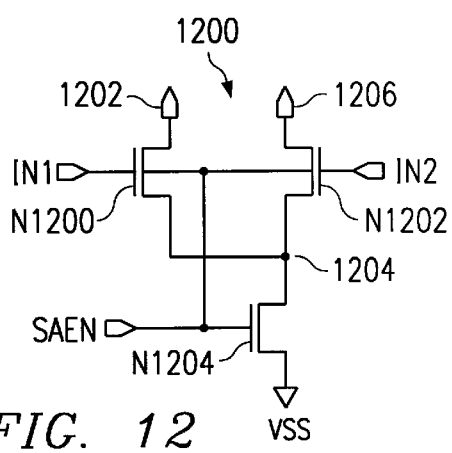
FIG. 12 is a schematic diagram illustrating an eighth embodiment.

An eighth embodiment, illustrating a sense amplifier circuit, is set forth in FIG. 12 and designated by the general reference character 1200. The eighth embodiment 1200 is shown to include a first n-channel MOS sense transistor N1200 having a source-drain path coupled between a first sense node 1202 and a current supply node 1204. The gate of transistor N1200 receives a first input signal IN1. In a mirror image fashion, a second n-channel MOS sense transistor N1202 has a source-drain path coupled between a second sense node 1206 and the current supply node 1204. The gate of transistor N1202 receives a second input signal IN2. The eighth embodiment 1200 further includes an n-channel current supply transistor N1204, having a source-drain path coupled between the current supply node 1204 and the low power supply voltage VSS. The gate of transistor N1204 receives a sense amplifier enable signal (SAEN). The SAEN signal is also coupled to the bodies of transistors N1200 and N1202.

In operation, when the SAEN signal is low (at VSS for example), transistor N1204 is turned off, and the bodies of transistors N1200 and N1202 are pulled low, increasing the Vtn of the transistors. This reduces current leakage in transistors N1200 and N1202. While the SAEN signal is low, a differential voltage is developed between the input signal IN1 and IN2. To initiate a sense operation, the SAEN signal pulses high. When SAEN transitions high, the bodies of transistors N1200 and N1202 are raised, lowering the Vtn of the transistors. Transistor N1204 is then switched on, enabling a current path between the sources of transistors N1200 and N1204 and the low power supply voltage VSS. With transistor N1204 turned on, the existing differential voltage between the sense nodes (1202 and 1206) will result in one of the sense nodes (1202 and 1206) being pulled toward the low power supply voltage VSS. For example, in the event the IN1 signal is higher than the IN2 signal, the first sense node 1202 will be pulled lower. If IN2 is higher than IN1, the second sense node 1204 will be pulled lower. The increase in the body potential of transistors N1200 and N1202 can result in a faster switching action than a conventional arrangement, in which the bodies are connected to the low power supply voltage VSS.

Figure 13:
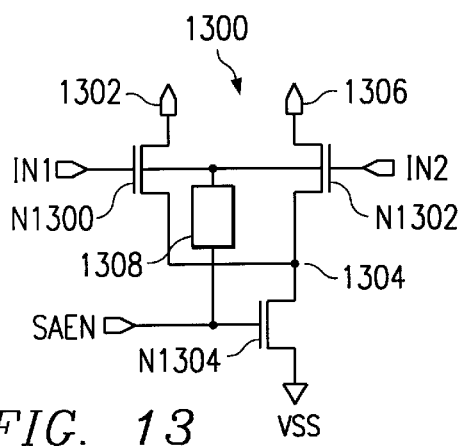
FIG. 13 is a schematic diagram illustrating a ninth embodiment.

A ninth embodiment is set forth in FIG. 13. The ninth embodiment is designated by the general reference character 1300 and includes many of the same circuit constituents of the eighth embodiment 1200. To that extent like elements will be referred to by the same reference character with the first two digits being a "13" instead of a "12." The various circuit elements of the ninth embodiment have the same general configuration as the eighth embodiment, except that the SAEN signal is coupled to the bodies of transistors N1300 and N1302 by a signal coupling element 1308. Various possible signal coupling elements 1308, not intended to be an exhaustive list, are set forth in FIGS. 14A–14E.

Figure 14A:
FIGS. 14A–14E are schematic diagrams illustrating signal coupling elements that may be used in the ninth embodiment.

The signal coupling element of FIG. 14A is a resistor, and may be particularly advantageous in increasing the delay between the activation of the SAEN signal, and the changing of the body voltages of transistors N1300 and N1302. In addition, the use of a resistor can reduce the adverse effect of differences in resistance between the connections to the bodies of transistors N1300 and N1302. Such differences in resistance can result in an unbalanced response between the sensing of one logic value and another. By using a resistor as the signal coupling element, such differences are minimized, as the signal coupling element will be the dominating resistance.

Figure 14B:
Figure 14C:
Figure 14D:
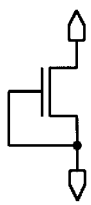

The signal elements of FIGS. 14B–14D illustrate examples of signal coupling elements that may be employed in the event a high SAEN pulse will draw too much current by forward biasing the body-source pn junction of transistors N1300 and N1302. By capacitively coupling the gate of transistor N1304 to bodies of transistors N1300 and N1302, as set forth by FIG. 14B, no direct current path will exist, and hence excessive current will not be drawn. The use of a diode, as shown by FIG. 14C, or a diode connected transistors, as shown by FIG. 14D increases the potential required to forward bias the body-source junctions of transistors N1300 and N1302. Of course, additional devices could be added in series to increase the potential necessary to cause such a forward biasing. Further, p-channel devices could be connected in a diode arrangement instead of n-channel devices.

Figure 14E:

The signal element of FIG. 14E illustrates a signal coupling element that may be used to adjust the delay between the activation of the SAEN signal and the adjustment of the body potentials of transistors N1200 and N1202.

Figure 15:
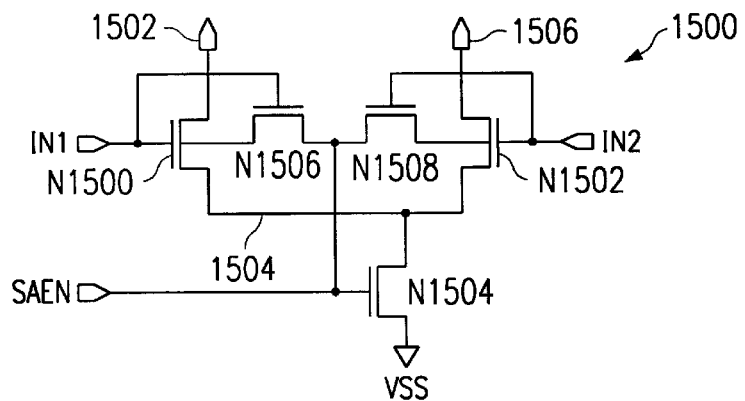
FIG. 15 is a schematic diagram of a tenth embodiment.

While the eighth and ninth embodiments set forth sense amplifier circuits whose threshold voltages are altered in response to a sense amplifier enable signal, the differential voltage signals received by the sense amplifier circuit can be also be used to alter the body voltages of transistors in the sense amplifier. Such a case is set forth in a tenth embodiment in FIG. 15. The tenth embodiment is designated by the general reference character 1500 and includes many of the same circuit constituents of the eighth embodiment 1200. To that extent like elements will be referred to by the same reference character with the first two digits being a "15" instead of a "12." The tenth embodiment 1500 differs from the eighth embodiment 1200 in that the SAEN signal is connected to the bodies of sense transistors N1500 and N1502 by the source-drain path of coupling transistors N1506 and N1508, respectively. The IN1 signal, in addition to being applied to the gate of sense transistor N1500, is further applied to the gate of transistor N1506. In a similar fashion, the IN2 signal is applied to the gates of both transistor N1502 and N1508.

The addition of the coupling transistors N1506 and N1508 results in the IN1 and IN2 signals determining which transistor body is pulsed. For example, in the arrangement of the tenth embodiment 1500, prior to the activation of the SAEN signal, if IN1 is higher than IN2, transistor N1506 will begin to turn on, while transistor N1508 will begin to turn off. In this manner, when the SAEN signal goes high the body of transistor N1500 will be pulsed high, lowering the Vtn of transistor N1500. Transistor N1504 will turn on, activating the circuit, resulting in the first sense node 1502 being pulled low. In this manner, input values enable paths to the bodies of those transistors that will be turned on. This lowers the threshold voltages of the transistors, speeding up the sense operation. It is understood that the coupling devices N1506 and N1508 are not limited to an n-channel MOS transistor. As just one example, p-channel transistors could be used. Such a configuration would require the gates of the p-channel transistors to receive opposite input signals (IN1 and IN2) to the arrangement shown in FIG. 15. Thus, the tenth embodiment 1500 illustrates a sense amplifier circuit that utilizes input signal values to imbalance the threshold voltages in favor of the applied differential voltage.

Figure 16:
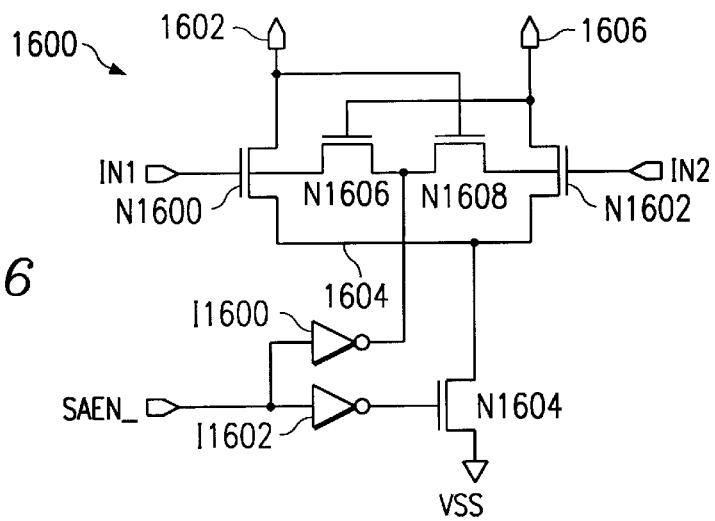
FIG. 16 is a schematic diagram of an eleventh embodiment.

An eleventh embodiment is set forth in FIG. 16. The eleventh embodiment is designated by the general reference character 1600 and illustrates an arrangement in which the potentials of the sense nodes are used to adjust the body voltages of sense transistors. The eleventh embodiment 1600 includes many of the same circuit constituents as the tenth embodiment 1500. To that extent, like elements will be referred to by the same reference character with the first two digits being a "16" instead of a "15."

The eleventh embodiment 1600 differs from the tenth embodiment 1500 in that the gates of coupling transistors N1606 and N1608 are coupled to the sense nodes (1602 and 1606) instead of receiving the input signals (IN1 and IN2). In particular, the gate of n-channel transistor N1606 is coupled to the second sense node 1606, and the gate of n-channel transistor N1608 is coupled to the first sense node 1602. In this arrangement, the relative potentials of the first and second sense nodes (1602 and 1606) will determine which transistor has its body voltage raised (and hence its threshold voltage lowered).

For example, in the event the IN1 signal is higher than the IN2 signal, the first sense node 1602 will be drawn toward the potential of the current supply node 1604. This lower potential is applied to the gate of transistor N1608, tending to turn off the transistor. The second sense node 1604 will remain at a higher potential, resulting in the higher potential being applied to the gate of transistor N1606. When the SAEN_ signal goes low, transistor N1604 is turned on, pulling the current supply node 1604 to VSS. The high voltage at the drain of transistor N1606 is applied to the body of transistor N1600, lowering its Vtn. The potential at the first sense node 1602 drops further, turning off transistor N1608. Thus, the eleventh embodiment 1600 illustrates a sense amplifier circuit that utilizes sense node values to imbalance the threshold voltages in favor of the differential voltage across the sense nodes.

The eleventh embodiment 1600 also illustrates how the sense amplifier enable signal (SAEN_ in the case of FIG. 16), can be applied to by way of various logic circuits. In the particular arrangement of FIG. 16, the SAEN_ signal is applied to the drains of sources N1606 and N1608 by way of an inverter I1600, and to the gate of transistor N1604 by way of inverter I1602.

Figure 17:
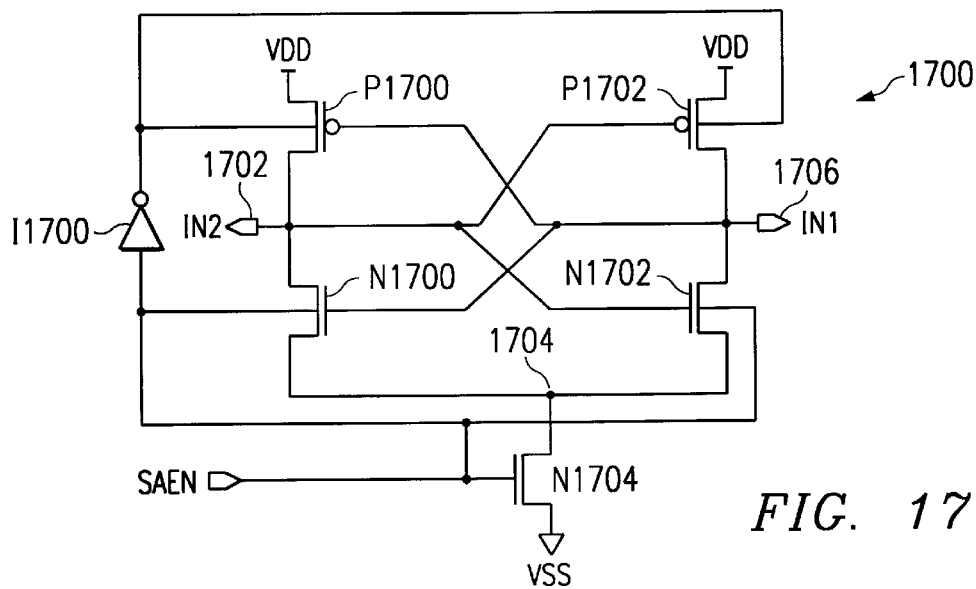
FIG. 17 is a schematic diagram of a twelfth embodiment.

While the previously described embodiments have set forth circuits utilizing n-channel sense transistors, it is understood that sense amplifier circuits using p-channel sense transistors can also benefit from teachings set forth herein. FIG. 17 illustrates a twelfth embodiment that employs complementary sense transistors. The twelfth embodiment is designated by the general reference character 1700, and includes many of the same circuit constituents as the eighth embodiment 1200. To that extent, like elements will be referred to by the same reference character with the first two digits being a "17" instead of a "12."

The twelfth embodiment 1700 differs from the eighth embodiment 1200 in that it further includes a first p-channel third sense transistors P1700 having a source-drain path coupled between the first sense node 1702 and a high power supply voltage. In a mirror image fashion, a second p-channel fourth sense transistor P1702 has a source-drain path coupled between the second sense node 1706 and the high power supply voltage. The SAEN signal is applied to the bodies of transistors P1700 and P1702 by way of an inverter I1700. Finally, first sense node 1702 receives the IN2 signal, and the second sense node 1706 receives the IN1 signal.

In the arrangement of the FIG. 17, when the SAEN signal is active (high), the operation of inverter I1700 results in a low potential being applied to the bodies of transistors P1700 and P1702. In this manner, the threshold voltages of transistors P1700 and P1702 are lowered in the sense operation, providing for faster activation of the transistors and hence more rapid performance.

Figure 18:
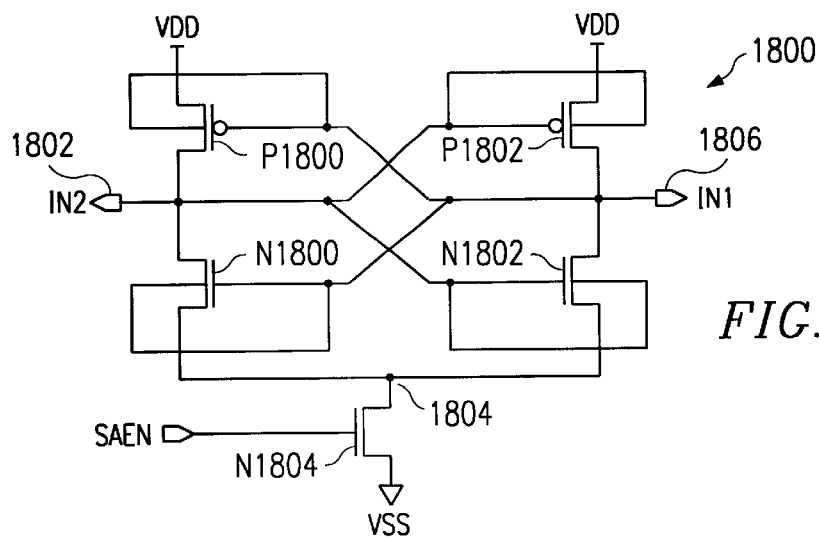
FIG. 18 is a schematic diagram of a thirteenth embodiment.

A thirteenth embodiment is set forth in FIG. 18. The thirteenth embodiment is designated by the general reference character 1800 and illustrates a sense amplifier arrangement in which the sense node potentials are used to modulate the body potentials. The thirteenth embodiment 1800 includes the same general circuit constituents as the twelfth embodiment 1700. To that extent, like elements will be referred to by the same reference character with the first two digits being an "18" instead of a "17."

The arrangement of the thirteenth embodiment 1800 differs from the twelfth embodiment in that the bodies of the various sense transistors (N1800, N1802, P1800 and P1802) are not driven by the SAEN signal, but instead are coupled to the sense nodes (1802 and 1806). In particular, the first sense node 1802 is coupled to the bodies of sense transistors P1802 and N1802, and the second sense node 1806 is coupled to the bodies of sense transistors P1800 and N1800. The IN2 signal is coupled to the first sense node 1802 and the IN1 signal is coupled to the second sense node 1806. When the IN1 signal is higher than the IN2 signal, the Vtn of sense transistor N1800 will be reduced, while the magnitude of the Vtp of sense transistor P1800 will be increased. Conversely, the Vtn of sense transistor N1802 will be increased and the magnitude of the Vtp of transistor P1802 will be decreased. Thus, when the SAEN signal is active, the change in Vtn and Vtp will provide for a faster sensing time. In this manner, the sense node potential can be used to imbalance the threshold voltages to favor switching according to the sense node differential voltage.

It is understood that while the p-channel sense transistors of the embodiments set forth herein are arranged with sources coupled to a high power supply voltage, it is understood that the sources could be commonly coupled to a high power supply voltage by a p-channel current supply transistor. The p-channel current supply transistor would be activated by a SAEN_ signal, that is the general inverse of the SAEN signal.

The previous sense amplifier embodiments have illustrated examples in which the bodies of transistors are driven by input signals, such as a sense amplifier enable signal, input voltage signals (IN1 and IN2), or sense nodes. However, it is noted that circuits can take advantage of lower threshold voltages by coupling the bodies of selected transistors to nodes within the circuit that are not at a power supply voltage. By doing so, faster sense times can be achieved.

Figure 19:
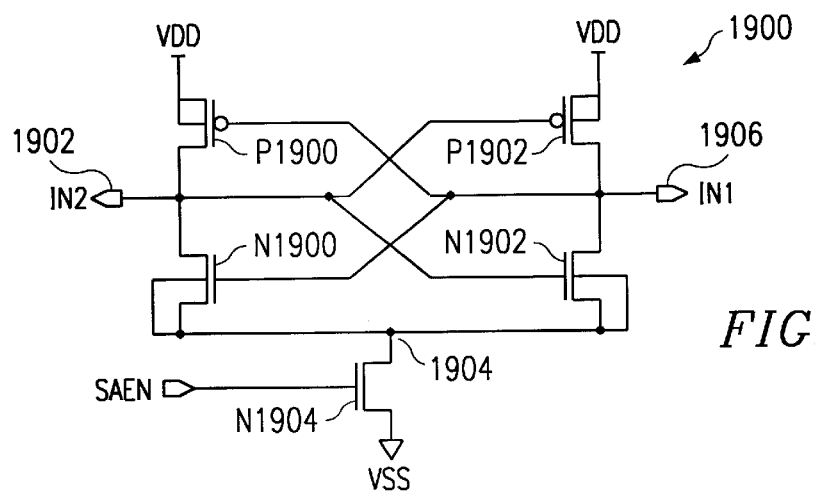
FIG. 19 is a schematic diagram of a fourteenth embodiment.

Referring now to FIG. 19, a schematic diagram of a fourteenth embodiment 1900 is set forth, illustrating a circuit in which the bodies of sense transistors are coupled to a node within the sense amplifier to lower the threshold voltages of the sense transistors. The fourteenth embodiment 1900 includes the same general circuit constituents as the twelfth embodiment 1700. To that extent, like elements will be referred to by the same reference character with the first two digits being a "19" instead of a "17."

Unlike the twelfth embodiment 1700, in which the bodies of the sense transistors (N1700, N1702, P1700 and P1702) are driven by a SAEN signal pulse, in the fourteenth embodiment 1900 the bodies of sense transistors N1900 and N1902 are coupled to the current supply node 1904. The current supply node 1904 will tend to stay above the low power supply voltage, VSS. Thus, by coupling the bodies of transistors N1900 and N1902 to the current supply node 1904, the sense transistors N1900 and N1902 will have lower Vtn than a conventional arrangement, in which the bodies of n-channel transistors are connected to the low power supply voltage VSS. Accordingly, when the SAEN signal is active, the sense operation of the fourteenth embodiment 1900 will provide a faster sense operation than prior art approaches.

Figure 20:
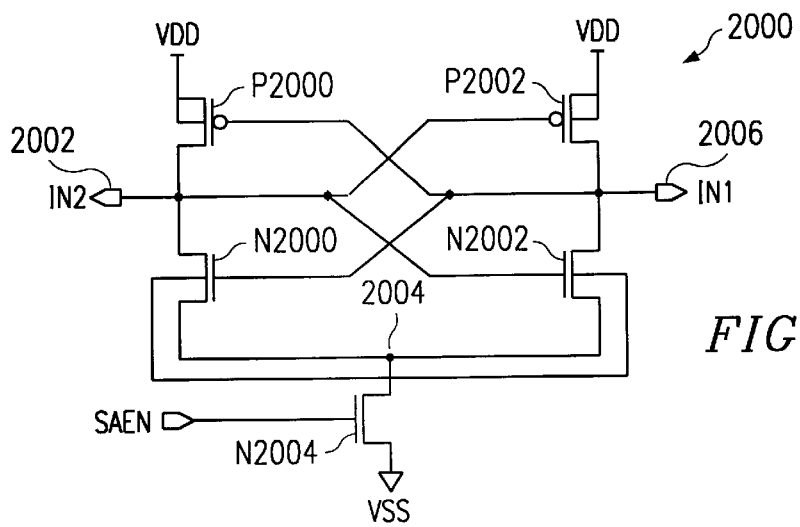
FIG. 20 is a schematic diagram of a fifteenth embodiment.

FIG. 20 sets forth a schematic diagram of a fifteenth embodiment. The fifteenth embodiment is designated by the general reference character 2000 and is shown to include many of the same general circuit constituents as the fourteenth embodiment 1900. To that extent, like elements will be referred to by the same reference character with the first two digits being an "20" instead of a "19." In the fifteenth embodiment 2000, the bodies of sense transistors N2000 and N2002 are coupled to one another, and allowed to float. In this manner, the bodies will drift to a potential above that of VSS, and so provide lower Vtns than conventional approaches.

It is understood that while the transistors of the various embodiments are described as "metal-oxide-semiconductor" transistors, this term is meant to include, without limitation, insulated gate field effect transistors in general. Furthermore, one skilled in the art would recognize that the teachings of the preferred embodiment can be applied over a wide range of technologies, including without limitation, single well CMOS technology, double well CMOS technology, and silicon-on-insulator technology.

Thus, it is understood that while the present invention has been described in terms of detailed preferred embodiments, various changes, substitutions, and alterations could be made without departing from the spirit and scope of the invention. Accordingly, the present invention is intended to be limited only as defined by the appended claims.

What is claimed is:

1. An integrated circuit, comprising:

a bulk semiconductor substrate having a first body region of a first conductivity type;

a first circuit insulated gate field effect transistor (IGFET) formed within the first body region, the first circuit IGFET including a source region and drain region of a second conductivity type formed within the first body region;

a first adjust IGFET having a source, a drain, and a gate, the source-drain path of the first adjust IGFET being coupled between the first body region and a first adjust voltage, the gate of the first adjust IGFET being coupled to a first pulse signal, the first pulse signal having an active portion that couples the first adjust voltage to the first body region, and an inactive portion that isolates the first body region from the first adjust voltage; and the adjust voltage is coupled to the first body region in order to briefly lower the threshold voltage of the first circuit insulated gate field effect transistor (IGFET) prior to the first circuit insulated gate field effect transistor (IGFET) becoming active.

2. The integrated circuit of claim 1, wherein:

the first circuit IGFET is an IGFET of the second conductivity type; and the first adjust IGFET is an IGFET of the first conductivity type.

3. The integrated circuit of claim 1, wherein:

the integrated circuit is coupled to a first power supply voltage; and the first adjust voltage is the first power supply voltage.

4. The integrated circuit of claim 1, further including:

the bulk semiconductor substrate further including a second body region of a second conductivity type;

a second circuit IGFET formed within the second body region, the second circuit IGFET including a source region and drain region of the first conductivity type formed within the second body region; and a second adjust IGFET having a source, a drain, and a gate, the source-drain path of the second adjust IGFET being coupled between the second body and a second adjust voltage, the gate of the second body pulse IGFET being coupled to a second pulse signal, the second pulse signal having an active portion that couples the second adjust voltage to the second body region, and an inactive portion that isolates the first body from the first adjust voltage.

5. The integrated circuit of claim 4, wherein:

the integrated circuit is coupled between a first power supply voltage and a second power supply voltage;

the first adjust voltage is the first power supply voltage; and the second adjust voltage is the second power supply voltage.

6. The integrated circuit of claim 1, wherein:

the integrated circuit is enabled by a timing signal; and the first pulse signal is derived from the timing signal.

7. The integrated circuit of claim 6, further including:

a first clocked IGFET having a gate coupled to the timing signal; and a pulse generator circuit that generates the first pulse signal when the timing signal transitions from a first predetermined value to a second predetermined value.

8. An integrated circuit, comprising:

a bulk semiconductor substrate having a first body region of a first conductivity type;

a first circuit insulated gate field effect transistor (IGFET) formed within the first body region, the first circuit IGFET including a source region and drain region of a second conductivity type formed within the first body region;

a first adjust IGFET having a source, a drain, and a gate, the source-drain path of the first adjust IGFET being coupled between the first body region and a first adjust voltage, the gate of the first adjust IGFET being coupled to a first pulse signal, the first pulse signal having an active portion that couples the first adjust voltage to the first body region, and an inactive portion that isolates the first body region from the first adjust voltage;

the integrated circuit is enabled by a timing signal, and the first pulse signal is derived from the timing signal; and a first clocked IGFET having a gate coupled to the timing signal; and a pulse generator circuit that generates the first pulse signal when the timing signal transitions from a first predetermined value to a second predetermined value, the pulse generator includes a delay circuit for delaying the first pulse signal with respect to the transitions in the timing signal.

9. The integrated circuit of claim 1, wherein:

the integrated circuit is coupled between a high power supply voltage and a low power supply voltage; and the first adjust voltage is higher in potential than the high power supply voltage.

10. The integrated circuit of claim 1, wherein:

the integrated circuit is coupled between a high power supply voltage and a low power supply voltage; and the first adjust voltage is lower in potential than the low power supply voltage.

11. The integrated circuit of claim 1, wherein:

the integrated circuit is coupled between a high power supply voltage and a low power supply voltage;

the first body is coupled to a body voltage that is greater than the high power supply voltage; and the first adjust voltage is the high power supply voltage.

12. The integrated circuit of claim 1, wherein:

the integrated circuit is coupled between a high power supply voltage and a low power supply voltage;

the first body is coupled to a body voltage that is less than the low power supply voltage; and the first adjust voltage is the low power supply voltage.

13. An integrated circuit, comprising:

a bulk semiconductor substrate having a first body region of a first conductivity type;

a first circuit insulated gate field effect transistor (IGFET) formed within the first body region, the first circuit IGFET including a source region and drain region of a second conductivity type formed within the first body region;

an input port coupled to the first circuit insulated gate field effect transistor (IGFET) for receiving an input signal, the first circuit insulated gate field effect transistor (IGFET) becomes active in response to the input signal;

a first adjust IGFET having a source, a drain, and a gate, the source-drain path of the first adjust IGFET being coupled between the first body region and a first adjust voltage, the gate of the first adjust IGFET being coupled to a first pulse signal, the first pulse signal having an active portion that couples the first adjust voltage to the first body region, and an inactive portion that isolates the first body region from the first adjust voltage;

the adjust voltage is coupled to the first body region in order to briefly lower the threshold voltage of the first circuit insulated gate field effect transistor (IGFET) prior to the input signal causing the first circuit insulated gate field effect transistor (IGFET) to become active; and the adjust voltage is coupled to the first body region in order to briefly lower the threshold voltage of the first circuit insulated gate field effect transistor (IGFET) prior to the input signal causing the first circuit insulated gate field effect transistor (IGFET) to go from an active to an deactivated state.

* * * * *